United States Patent [19]
Polak et al.

[11] Patent Number: 5,689,089
[45] Date of Patent: Nov. 18, 1997

[54] ELECTRONIC CONTROL MODULE HAVING FLUID-TIGHT SEALS OF A POLYMER MATERIAL WHICH EXPANDS WHEN WET

[75] Inventors: Anthony J. Polak, Lake Zurich; Charles Vandommelen, Villa Park; Fred E. Ostrem, Long Grove, all of Ill.

[73] Assignee: Motorola, Inc., Schaumburg, Ill.

[21] Appl. No.: 717,048

[22] Filed: Sep. 20, 1996

[51] Int. Cl.⁶ .................................................. H01L 23/02
[52] U.S. Cl. .................... 174/52.4; 257/710; 257/729; 174/52.2; 174/52.3
[58] Field of Search .................... 174/52.4, 52.3, 174/65 SS, 52.2; 277/DIG. 6; 285/925; 257/709, 710, 729, 787, 788, 791

[56] References Cited

U.S. PATENT DOCUMENTS

| | | |
|---|---|---|
| 3,900,126 | 8/1975 | Ishikawa et al. . |
| 3,911,744 | 10/1975 | Edwards . |
| 4,490,614 | 12/1984 | Peerenboom . |
| 5,096,206 | 3/1992 | Andre et al. ................................ 277/1 |
| 5,209,368 | 5/1993 | Bradenbaugh . |
| 5,210,769 | 5/1993 | Seidel et al. . |
| 5,218,304 | 6/1993 | Kinlen et al. . |
| 5,256,901 | 10/1993 | Ohashi et al. ........................ 257/680 |
| 5,342,065 | 8/1994 | Blanke . |

FOREIGN PATENT DOCUMENTS

| | | |
|---|---|---|
| 2 655 076 | 5/1991 | France . |
| 1 569 903 | 11/1965 | Germany . |
| 51-38349 | 3/1976 | Japan . |
| 1034999 | 7/1966 | United Kingdom . |

OTHER PUBLICATIONS

Dow Corning product information material, 1993, 1991.

*Primary Examiner*—Kristine L. Kincaid
*Assistant Examiner*—Kristina Soderquist
*Attorney, Agent, or Firm*—Jasper W. Dockrey

[57] ABSTRACT

An electronic control module (10) includes a package substrate (12) having an interior cavity (28) through which a package lead (22) traverses. The interior cavity (28) is filled with an expandable polymer material (34). The expandable polymer material (34) is constrained within the cavity by a pressure resistive layer (32, 35) that overlies expandable polymer material (34) In one embodiment, an epoxy layer (32) forms an upper surface of the interior cavity (28). The expandable polymer material (34) is responsive to a fluid, such that upon contact with a fluid diffusing along the package lead (22), the expandable polymer material (34) will swell and form a fluid-tight pressure seal around the package lead (22). The fluid-tight pressure seal prevents the fluid from diffusing to interior portions of the electronic control module (10) and causing the failure of electronic components (18) mounted within the electronic module (10).

15 Claims, 2 Drawing Sheets

ELECTRONIC CONTROL MODULE HAVING FLUID-TIGHT SEALS OF A POLYMER MATERIAL WHICH EXPANDS WHEN WET

FIELD OF THE INVENTION

This invention relates, in general, to electronic packages having hermetic seals, and more particularly, to hermetic electronic modules containing an electronic device and having fluid-tight seals for use in automotive applications.

BACKGROUND OF THE INVENTION

Hermetic sealing of packaged electronic devices is important in situations where the electronic device is to operate in a corrosive environment. In any electronic package, an electrical connection must be made from the outside world to the electronic components inside the package. Typically, the electrical connection is provided by a leadframe molded into the plastic body of the package. The molding process forms a mechanical seal around the leadframe, however, the molding process does not form a chemical bond between the leadframe and the plastic package body. Simply molding a leadframe into the plastic package body does not form a hermetic seal, because air and liquids can migrate along the leadframe and enter the interior regions of the package through the package wall. As electronics technology advances, more complex electronic devices are housed in plastic packages. The complex devices show high sensitivity to contamination and can readily fail upon contact by oxidants and corrosive fluids.

Truly hermetic packages require extensive sealing technology to prevent air and fluids from penetrating into the interior of the package. One technique for fabricating a hermetic package involves the use of metal packaging rather than plastic and glass or ceramic feed-throughs. Electrical connections can be made by soldering leads to each end of the feed-through, after the feed-through is sealed to the metal wall of the package. While this method is effective for the fabrication of a hermetic package, metal packages having glass and ceramics components are expensive. Additionally, a glass or ceramic feed-through is a mechanically delicate electrical seal, and can be damaged if the package is subject to vibration or jarring while in use.

Epoxy materials represent one alternative to glass and ceramics for the fabrication of hermetic seals. Epoxy sealing technology can be used with plastic to reduce packaging costs with the additional advantage of wide utility for many different packaging materials and package designs. To form a hermetic seal, an epoxy potting material is applied around the leadframe where it exits the plastic package body. Because there is no practical method of applying the potting material to the interface, the potting material is applied to outer surfaces of the package body rather than directly to the leadframe-package body interface. The potting material requires good adhesion to both the leadframe and the plastic package body in order to maintain a hermetic seal.

While epoxy potting materials can be used to form a hermetic seal, these materials can be adversely affected by corrosive gases and fluids contacting the outer surfaces of the plastic package body. Although epoxy can be hardened, a hardened epoxy can have a coefficient of thermal expansion that differs from the plastic packaging material. Differences in thermally induced expansion of the epoxy and the plastic over the temperature ranges in which many electronic devices must function can easily lead to cracking and loss of hermeticity. In addition to cracking problems, epoxy seals are not suitable where the package is to be exposed to hydrocarbon fluids, such as oils, solvents, and the like, or strong oxidizing acids. Accordingly, new package sealing techniques are required for electronic modules that are to be operated in corrosive chemical environments.

Figure 1A:
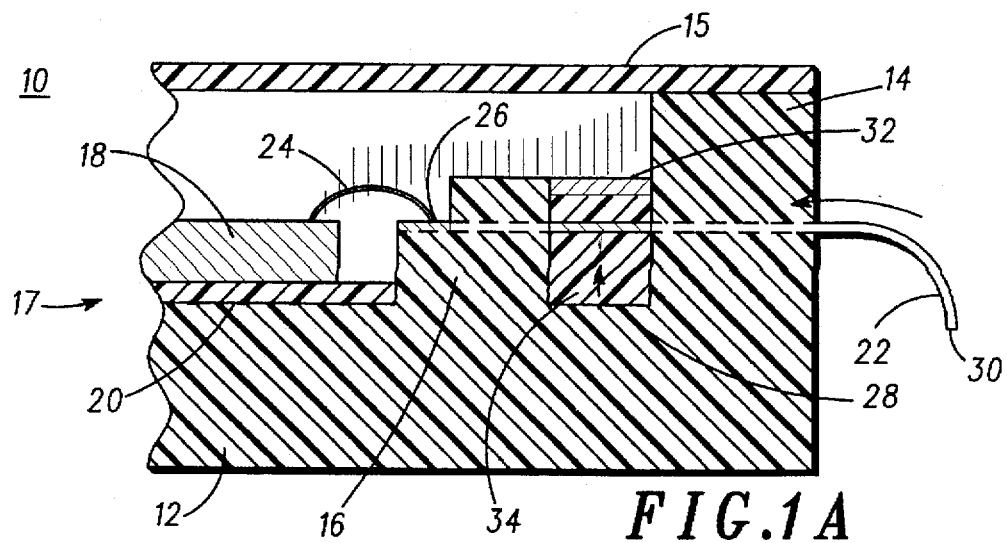
FIG. 1A illustrates, in cross-section, a portion of an electronic module arranged in accordance with one embodiment of the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention is for an electronic module that is capable of preventing fluids from entering the module and damaging internal electronic components. Electronic modules can be exposed to corrosive fluids from a harsh operating environment. The module design of the invention prevents fluid from entering along major ingress pathways by placing an expandable polymer material within an interior cavity that is aligned to the fluid ingress pathway. When a fluid to which the electronic module is exposed contacts the expandable polymer material, the polymer material swells to form a fluid-tight seal, thus closing the ingress pathway. In one aspect, the invention provides an expandable material that is responsive to a fluid entering the electronic module along an ingress pathway. The seal remains dormant until such time as a fluid attempts to enter the electronic module, and at that time the polymer begins absorbing the fluid and expands to form a fluid-tight seal.

Shown in FIG. 1A, in cross-section, is a portion of an electronic module 10 arranged in accordance with one embodiment of the invention. A package substrate 12 includes an outer wall section 14 and a bond pad platform 16. Electronic module 10 includes a cover 15 overlying package substrate 12. Package substrate 12 and cover 15 cooperate to form a housing 17 protecting an electronic component 18. Cover 15 is hermetically bonded to package substrate 12 to provide a fluid-tight seal between the cover and the package substrate.

An electronic component 18 is bonded to package substrate 12 by an adhesive layer 20 and wire bonded to a package lead 22 by wire bond 24. Package lead 22 has an exposed interior portion 26 overlying bond pad platform 16. Wire bond 24 is bonded to interior portion 26, such that package lead 22 is electrically coupled to electronic component 18. Package lead 22 extends through an interior portion of bond pad platform 16 and traverses an interior cavity 28. Package lead 22 also extends through an interior portion of wall section 14, and an exposed terminal end 30 extends outward from wall section 14, such that electrical contact to external systems can be made to electronic module 10.

Interior cavity 28 is enclosed by an epoxy seal 32, which functions as a cover over interior cavity 28. An expandable polymer material 34 resides in interior cavity 28. When package lead 22 is exposed to a fluid, such as a hydrocarbon fluid, water, liquid solvents, and the like, a major ingress pathway is created by diffusion of the fluid along package lead 22. If the diffusion of the fluid is not impeded, the fluid will eventually diffuse along package lead 22 to interior portion 26, then along wire bond 24 eventually reaching electronic component 18. In accordance with the invention, expandable polymer material 34 is responsive to a fluid diffusing along package lead 22, such that polymer material 34 expands against epoxy seal 32. The expansion of polymer material 34 creates pressure around the portion of package lead 22 traversing interior cavity 28. The pressure created by polymer material 34 seals package lead 22 to package substrate 12. The seal formed by the expansion of polymer material 34 prevents fluid from diffusing to interior portions of electronic module 10, such as bond pad platform 16.

Figure 1B:
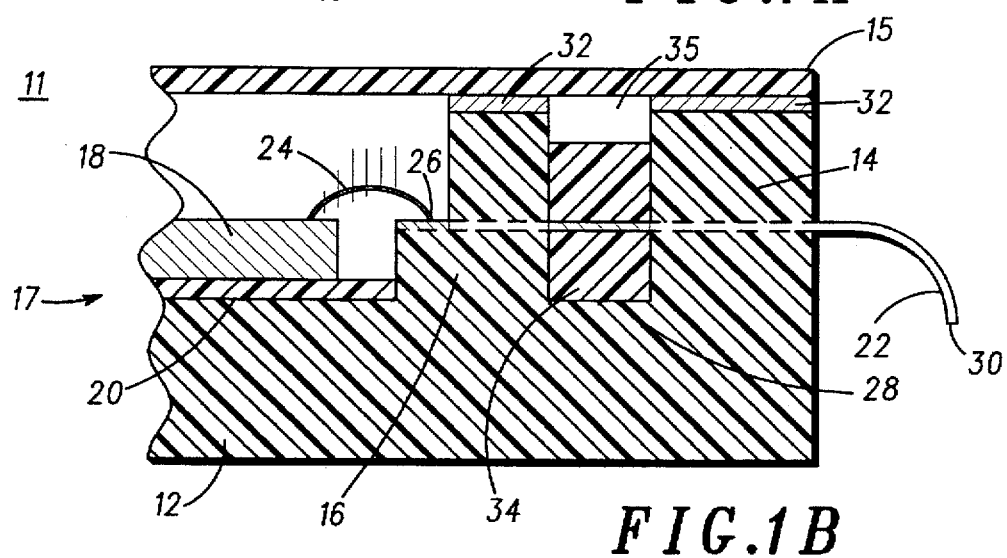
FIG. 1B illustrates, in cross-section, a portion of an electronic module arranged in accordance with an alternative embodiment of the invention.

An electronic module 11 in accordance with an alternative embodiment of the invention is illustrated in cross-section in FIG. 1B. In the alternative embodiment, interior cavity 28 and bond pad platform 16 extend to the upper surface of package substrate. Epoxy seal 32 separates wall surface 14 and bond pad platform 16 from cover 15 and seals interior cavity 28. An air pocket 35 overlies expandable polymer 34 within interior cavity 28. When expandable polymer 34 swells upon contact with a fluid, air pocket 35 provides a counter force opposing the expansion of expandable polymer 34. The resistance provided by air pocket 35 increases the pressure within interior cavity 28 sealing package lead 22 to package substrate 12.

The alternative embodiment illustrates the use of a deformable media, such as air, to provide a resistive force within interior cavity 28. Those skilled in the art will appreciate that other materials and structures, such as a gas filled bladder, and the like can be used, to counter the expansion force of expandable polymer 34 and increased the pressure about package lead 22.

In a preferred embodiment of the invention, polymer material 34 is a silicone-based polymer capable of volumetric expansion upon contact with a fluid, such as a hydrocarbon fluid. Most preferably, the silicone-based polymer is a substituted polysiloxane containing repeating alkyl-substituted monomer units, or a random copolymer containing halogenated alkyl substituents. For example, an alkyl-substituted polymer can be used having the general formula, $[SiR_2O]_n$, where R is an alkyl substituent, and n is a large positive integer that indicates the number of repeating monomer units in the alkyl-substituted polysiloxane polymer.

Where polymer material 34 is a polysiloxane, the most preferred material is dimethyl polysiloxane. The preferred polysiloxane material, dimethyl polysiloxane, can be a primerless silicone adhesive that develops a strong self-priming adhesive bond upon thermal curing. One such silicone adhesive is available from Dow Corning Corp. of Midland, Mich. and sold under the tradename "SYLGARD 577." After curing, the preferred silicone adhesive has a specific gravity of 1.32 at 25° C., a tensile strength of 860 psi, and a lap share strength of 770 psi. Experimental results indicate that upon exposure to a long chain ($C_{16}$ to $C_{20}$) hydrocarbon fluid, such as automotive power steering fluid available from Deutsche Pentosin-Werke GmbH of Wedel, Germany and sold under the trade name "PENTOSIN," the dimethyl polysiloxane will undergo a volumetric expansion ranging between about 49 to about 71 percent depending upon the exposure time. The experimental data collected for dimethyl polysiloxane is shown in Table I.

TABLE I

| MATERIAL | % VOLUME CHANGE* |
| --- | --- |
| Dimethyl Polysiloxane | 71 |
| Fluorinated Polysiloxane | 14 |

*168 hr. exposure to Pentosin power steering fluid

Where polymer material 34 is a random co-polymeric polysiloxane, the preferred material is a fluorosiloxane where $R_1$ is $C_3H_4F_3$, and $R_2$ and $R_3$ are $CH_3$, and the ratio of polymer units is n:m is about 40:60. A random co-polymeric, halogenated polysiloxane can be used having the general formula $[(SiR_1R_2O)_n)SiR_3O)_m]$, where $R_1$ is an alkyl substituent having a halogen, such as fluorine, and $R_2$ and $R_3$ are alkyl substituents, and where n and m are positive integers existing in various ratios depending upon the particular polysiloxane compound.

The most preferred halogenated polysiloxane is a random, co-polymeric fluorinated polysiloxane having the chemical formula $[Si(CH_3)(CH_2CH_2CF_3)O)]_4[Si(CH_3)_2O)]_6$. The preferred fluorine substitute polysiloxane is 40 percent stoichiometric fluorine substituted, and shows good adhesive properties upon thermal curing. A suitable fluorinated polysiloxane is available from Dow Corning Corp. of Midland, Mich. under the tradename "X4-8012." The fluorinated polysiloxane exhibits a specific gravity of 1.28 upon thermal curing and has a tensile strength of 790 psi. Experimental results indicate that the fluorinated polysiloxane will undergo a volume expansion of about 14 to 21 percent upon exposure to a hydrocarbon fluid such as automotive power steering fluid. The experimental data for the fluorinated polysiloxane is shown in table I.

Referring to FIGS. 1A or 1B, in an assembly process, one of the foregoing preferred polysiloxane compounds is deposited into interior cavity 28 after package lead 22 has been molded into package substrate 12. Epoxy seal 32 is applied and cured to form a pressure resistive cover over interior cavity 28. Upon contact with a hydrocarbon oil, the polysiloxane expands exerting a pressure on all six sides of interior cavity 28.

As shown in Table I, upon a contact with automotive power steering fluid, the preferred fluorinated polysiloxane will increase in volume by about 14 percent. This expansion will exert a pressure within interior cavity 28 of about 45 MPa. The substantial pressure exerted by the fluorinated polysiloxane effectively prevents the power steering fluid from diffusing through bond pad platform 16 and contaminating the wire bond formed at interior portion 26 of package lead 22.

Those skilled in the art will appreciate that the interactive package sealing mechanism of the invention can be applied to a wide variety of electronic modules. For example, a cavity containing an expandable polymer material can be formed in electronic packages designed to protect integrated circuit components. In addition, the invention can be used in other types of packages designed to protect sophisticated electronic devices, such as multichip modules, hybrid power transistor arrays, engine control units, and the like.

Furthermore, the reactive sealing mechanism of the invention can be employed in any package design where it is desired to prevent a fluid from entering the interior spaces of the package along a diffusion pathway. Accordingly, the following exemplary embodiment is but one of many such possible arrangements for the incorporation of the reactive sealing mechanism of the invention in an electronic module.

Figure 4:
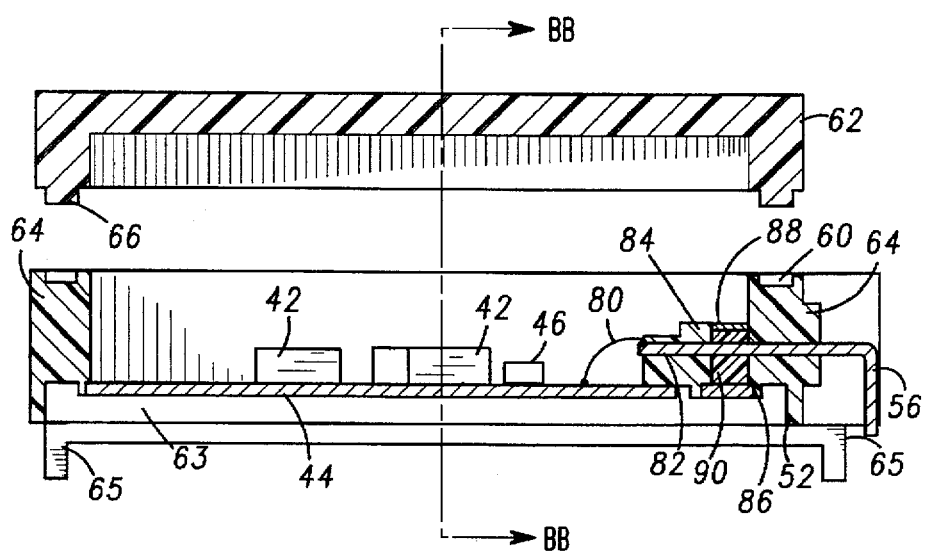
FIG. 4 is a cross-sectional assembly view of the electronic module shown in FIG. 2 taken along section lines 4—4.
Figure 2:
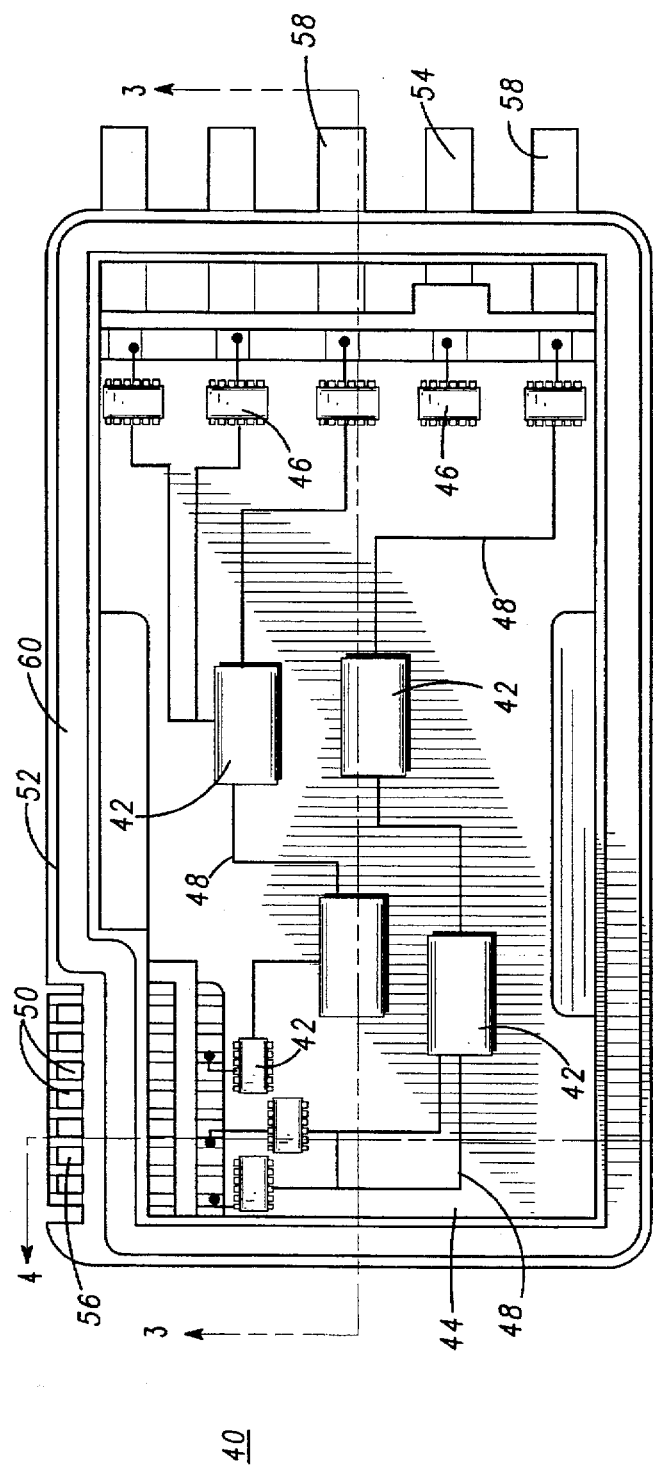
FIG. 2 is a top view of an electronic module arranged in accordance with an exemplary embodiment of the invention.
Figure 3:
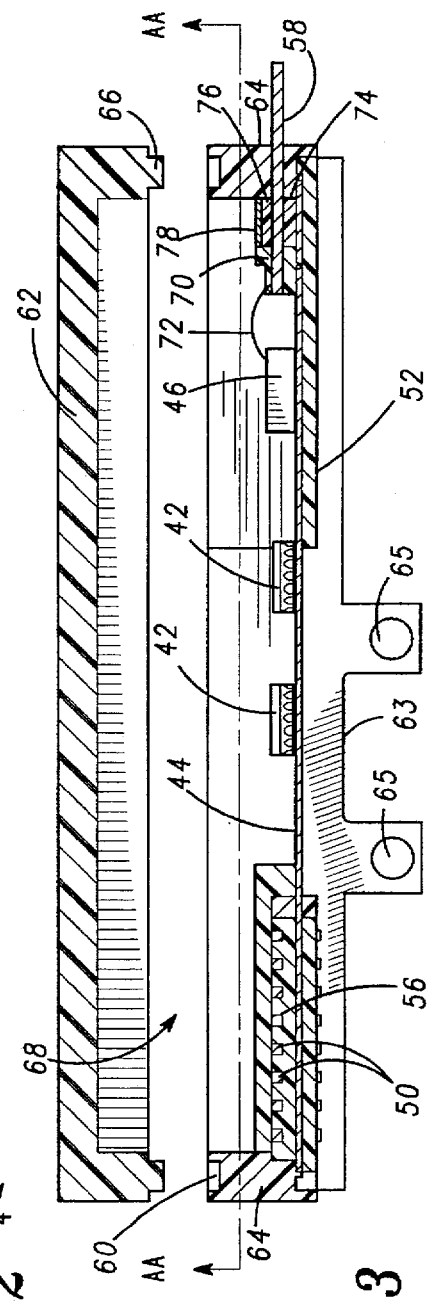
FIG. 3 is a cross-sectional assembly view of the electronic module shown in FIG. 2 taken along section lines 3—3.

FIGS. 2–4 illustrate various views of an electronic module 40 arranged in accordance with an exemplary embodiment of the invention. Shown in FIG. 2 is a top view of an electronic module 40 that is configured for emersion into a hydrocarbon fluid. A plurality of electronic components 42 overlie a printed circuit board 44 and are interconnected with each other and to a plurality of power transistors 46 by interconnect leads 40. Control signals from external electric control circuitry (not shown) are electrically coupled to electronic components 42 by a first leadframe 50 that is molded into a package substrate 52 of electronic component 40. Power control signals are output from power transistors 46 to external drive motors (not shown) by a second leadframe 54. Both first and second leadframes 50 and 54 include a plurality of metal leads 56 and 58 respectively, that carry the electrical signals to and from electronic control module 40. A peripheral groove 60 extends around the perimeter of package substrate 52 and is configured to receive a cover 62.

A cross-sectional assembly view of electronic module 40 taken along section line 3—3 of FIG. 2 is shown in FIG. 3. Package substrate 52 includes an exterior wall surface 64 within which peripheral groove 60 is formed. A tongue 66 depending from cover 62 and inserts into peripheral groove 60. Tongue 66 is bonded peripheral groove 60 to form a fluid-tight seal between cover 62 and package substrate 52. A heat spreader 63 is molded into package substrate 52 and provides a support for printed circuit board 44. Heat spreader 63 functions to dissipate the large amount of heat generated by power transistors to during operation of electronic module 40. Heat spreader also includes attachment means 65 for mounting electronic module 40 to a surface of an automotive power steering reservoir.

When cover 62 and package substrate 52 are brought together and sealed, electronic components 42 and power transistors 46 are enclosed within an interior cavity 68. Power transistors 46 are wire bonded to an interior portion 70 of metal lead 58 by a wire bond 72. Metal lead 58 extends through a second interior cavity 74 and wall surface 64, an expandable polymer material 76 resides in second cavity 74 and is contained therein by an epoxy layer 78.

A cross-sectional assembly view of electronic module 40 taken along section line 4—4 of FIG. 2 is shown in FIG. 4. A wire bond 80 electrically couples electronic components 42 through interconnect leads 48 to an interior portion 82 of metal lead 56. Metal lead 56 is bonded to a bond pad platform 84 and wall surface 64 of package substrate 52. Metal lead 56 traverses a third interior cavity 86.

In an arrangement similar to the sealing mechanism of second cavity 74, an epoxy seal 88 overlies a polymer material 90 deposited within third cavity 86. In the illustrative embodiment, the individual metal leads of leadframe 50 are considerably smaller and more numerous than the individual metal leads of second leadframe 54. It is important to note that, despite the disparity in lead dimensions, the reactive sealing mechanism of the invention can be employed to form a pressurized seal around leads of various dimensions and form a fluid tight barrier between a package body and metal leads having various physical characteristics. Because the polymer material employed within second and third cavities 74 and 86 becomes deformable upon contact with a hydrocarbon fluid, the polymer material can form a tight seal around virtually any cross-sectional lead geometry. Furthermore, the deformable nature of the polymer material permits the material to be employed in a cavity having substantially different geometric aspects than those illustrated herein. For example, the cavity can be entirely enclosed within substrate material and be introduced through an access port within the substrate. Those skilled in the art will appreciate that many such variations are possible to employ the reactive sealing mechanism of the invention and those various geometries are within the scope of the present invention.

In the present illustrative embodiment, electronic module 40 is designed to be attached by attachment means 65 to metal supports within the power steering mechanism of an automobile. The point of attachment is such that in operation, electronic module 40 will be entirely submerged in power steering fluid within a power steering apparatus. The large amount of heat generated by the operation of electronic module 40 will be dissipated by heat spreader 63, and by heat transfer from the package housing to the surrounding power steering fluid. Because electronic module 40 will spend its entire functional life submerged in power steering fluid, the protection of electronic components 42 and power transistors 46 from contamination from the power steering fluid, requires perfect fluid-tight sealing about all exterior surfaces of the package housing. In accordance with the invention, expandable polymer materials 76 and 90 stand ready to respond to the presence of any power steering fluid diffusing along metal leads 56 or 58.

Thus it is apparent that there has been provided, in accordance with the invention, an electronic control module having fluid-tight seals, that fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other types of packaging materials, such as polyimides, silicone plastics, refractory-metal impregnated plastics, and the like can be used. Furthermore, tape bonding and surface mount technology can be employed. It is therefore intended to include within the invention all such variations and modifications as fall within the scope of the appended claims and equivalents thereof.

We claim:

1. An electronic module comprising:
   a housing configured for immersion in a fluid;
   a first cavity within the housing;
   a leadframe mounted within the housing and having a plurality of leads extending from the first cavity through an exterior wall of the housing;
   an electronic component electrically coupled to the leadframe;
   a second cavity intermediate to the first cavity and the exterior wall,
   wherein a portion of the plurality of leads traverse the second cavity; and
   a silicone-based polymer within the second cavity,
   wherein the silicone-based polymer expands upon contact with the fluid and fills the second cavity sealing the plurality of leads within the second cavity and preventing the fluid from entering the first cavity.

2. The electronic module of claim 1, wherein the silicone-based polymer comprises a polymer selected from the group consisting of halogenated polysiloxane and alkyl substituted polysiloxane.

3. The electronic module of claim 2, wherein the halogenated polysiloxane comprises fluorinated polysiloxane and the alkyl substituted polysiloxane comprises dimethyl siloxane.

4. The electronic module of claim 1 further comprising:

an epoxy seal overlying the silicone-based polymer and forming an upper surface of the second cavity and, wherein the epoxy seal defines a volume of the second cavity.

5. An electronic module comprising:

a housing having an exterior surface configured for exposure to a fluid;

an electronic component mounted within the housing;

an interior cavity within the housing intermediate to the electronic component and the exterior surface;

electrical connections coupled to the electronic component and extending through the interior cavity and the exterior surface;

a polymer material within the interior cavity responsive to the fluid, such that the polymer material expands upon contact with the fluid sealing the electrical connections within the interior cavity and preventing the fluid from contacting the component; and a sealing layer within the interior cavity configured for containing the polymer material.

6. The electronic module of claim 5, wherein the polymer material comprises a silicone-based polymer selected from the group consisting of halogenated polysiloxane and alkyl substituted polysiloxane.

7. The electronic module of claim 5, wherein the sealing layer comprises epoxy positioned in the interior cavity above the polymer material.

8. The electronic module of claim 5, wherein the electrical connections comprise a metal leadframe attached to the housing.

9. The electronic module of claim 5, wherein the fluid comprises a hydrocarbon fluid.

10. An electronic module comprising:

a housing;

a cavity within the housing;

an electrical lead traversing the cavity and having a terminal end extending beyond the housing, wherein the terminal end is exposed to a fluid; and an expandable polymer material within the cavity and confined by said pressure resistive layer;

a pressure resistive layer overlying the expandable polymer, wherein the pressure resistive layer and the expandable polymer cooperate to form a seal surrounding the electrical lead and sealing the lead to the housing upon contact of the expandable polymer by the fluid.

11. The electronic module of claim 10, wherein the housing comprises:

a package substrate having a peripheral groove therein; and a cover having a tongue depending therefore, wherein the tongue is inserted into the groove to form a fluid-tight seal.

12. The electronic module of claim 10, wherein the pressure resistive layer comprises a deformable media.

13. The electronic module of claim 10, wherein the pressure resistive layer comprises an epoxy layer positioned within the cavity.

14. The electronic module of claim 10, wherein the expandable polymer material comprises a silicone-based polymer selected from the group consisting of halogenated polysiloxane and alkyl substituted polysiloxane.

15. The electronic module of claim 10, wherein the fluid comprises a hydrocarbon fluid.

* * * * *